United States Patent
Jain et al.

(10) Patent No.: US 10,955,473 B1
(45) Date of Patent: Mar. 23, 2021

(54) SYSTEM AND METHOD OF SCAN RESET UPON ENTERING SCAN MODE

(71) Applicant: NXP B.V., Eindhoven (NL)

(72) Inventors: Sandeep Jain, Noida (IN); Thomas E. Tkacik, Phoenix, AZ (US); Nikila Krishnamoorthy, Chennai (IN)

(73) Assignee: NXP B.V., Eindhoven (NL)

( * ) Notice: Subject to any disclaimer, the term of this patent is extended or adjusted under 35 U.S.C. 154(b) by 10 days.

(21) Appl. No.: 16/672,287

(22) Filed: Nov. 1, 2019

(51) Int. Cl.
*G01R 31/3177* (2006.01)
*G01R 31/317* (2006.01)
*G06F 12/14* (2006.01)

(52) U.S. Cl.
CPC ... *G01R 31/3177* (2013.01); *G01R 31/31727* (2013.01); *G06F 12/1425* (2013.01); *G06F 2212/1052* (2013.01)

(58) Field of Classification Search
CPC .......... G01R 31/3177; G01R 31/31727; G06F 12/1425; G06F 2212/1052
USPC ................................. 714/727, 726, 729, 731
See application file for complete search history.

(56) References Cited

U.S. PATENT DOCUMENTS

| | | | |
|---|---|---|---|
| 7,185,249 B2 | 2/2007 | Tkacik et al. | |
| 7,308,625 B1 * | 12/2007 | Wingen | G01R 31/3016 324/76.35 |
| 7,725,788 B2 | 5/2010 | Tkacik et al. | |
| 7,975,307 B2 | 7/2011 | Tkacik et al. | |
| 7,987,331 B2 | 7/2011 | Borri | |
| 9,927,490 B2 | 3/2018 | Hao et al. | |
| 2006/0020864 A1 | 1/2006 | Turner et al. | |
| 2010/0023719 A1 | 1/2010 | Borri | |
| 2012/0062283 A1 | 3/2012 | Kwan et al. | |
| 2013/0254609 A1 * | 9/2013 | Yonetoku | G01R 31/31855 714/729 |
| 2018/0203065 A1 * | 7/2018 | Dani | G01R 31/31725 |

OTHER PUBLICATIONS

Datta et al., Tri-Scan: A Novel DFT Technique for CMOS Path Delay Fault Testing, 2004, IEEE, pp. 1118-1127. (Year: 2004).*

* cited by examiner

Primary Examiner — John J Tabone, Jr.

(57) ABSTRACT

A semiconductor device including scan configuration circuitry that reconfigures latches of the device into a scan chain in response to assertion of a scan enable control signal, and scan control circuitry including delay circuitry, scan enable circuitry, evaluation circuitry, and scan reset circuitry. The scan reset circuitry keeps each of the secure latches in a predetermined reset state until assertion of both an evaluation signal and a scan mode signal. The delay circuitry includes N series-coupled flip-flops selected from different cell libraries detecting assertion of the scan mode signal and asserting a delay output signal only after N transitions of a test clock. The scan enable circuitry asserts the scan enable control signal when a scan enable command signal and the delay output signal are both asserted. The evaluation circuitry asserts the evaluation signal only when a collective state of the delay circuitry has achieved a predetermined state.

20 Claims, 4 Drawing Sheets

SYSTEM AND METHOD OF SCAN RESET UPON ENTERING SCAN MODE

BACKGROUND

Field of the Invention

The present invention relates in general to scan testing a secure device, and more particularly to a system and method of resetting the secure device upon entering a scan mode for performing a scan test operation to protect secure information contained within the secure device.

Description of the Related Art

Scan testing a device is typically performed by reconfiguring the storage elements of the device into a scan chain between a scan input and a scan output. For more complex devices, such as processors and the like, multiple scan chains may be formed between corresponding scan inputs and outputs. In each chain, multiple elements are serially linked together so that an output of one element is linked to an input of the next element, and so on. Sometimes, circuit designers use scan chains to provide test access to internal elements of a device that would be otherwise inaccessible. By reconfiguring the elements into a scan chain, a test engineer can shift data into the scan input, reconfigure the device into normal operating mode, clock the elements at least once, reconfigure the elements back into a scan chain, and then sequentially read out the results at the scan output. In this way a maximum amount of internal circuitry can be tested with a minimum of additional complexity.

Some devices, however, are considered "secure" in which they contain sensitive data that should only be accessed by authorized personnel. If the circuitry containing the sensitive data is included in the scan chain, then the sensitive data may be read out and accessed by unauthorized personnel. Authorization details to enter the scan test mode are often not published, but these details are not cryptographically strong so that an additional layer of protection is needed for the sensitive data. Some manufacturers have simply removed the circuitry containing the sensitive data from being part of the scan chain. This solution, however, leaves a significant portion of a semiconductor chip from being tested which is disadvantageous for various reasons. Another existing method is to issue a global reset before commencing scan operation. The duration of the reset, however, is controlled by a simple counter which operates on an external clock that can easily be manipulated. Tampering with the clock frequency or duty cycle of the test clock can result in conditions in which all of the scan elements are not reliably cleared, thereby potentially exposing the sensitive data to external access.

Enabling scan-compression may not be sufficient to protect the sensitive data. A compressed signature (MISR) does not offer crypto security so that it can be decoded to extract information. Most compression engines support bypass or one-hot modes for diagnostics and the like that cannot be reliably turned off. The use of crypto-grade passwords or challenge-response mechanisms to allow scan operation (especially after a certain Lifecycle) may also be insufficient. When running in-field, the security module may be running operations utilizing keys from a customer or from third party vendors. Also, a scan may be triggered by personnel of the manufacturer who may be able to access the sensitive data without proper authorization.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

The inventors have recognized that additional measures may be needed to prevent access to secure data in a semiconductor device. They have therefore developed a system and method of enforcing a mandatory reset before initiating a scan operation to prevent any secure data from being read out during scan mode. The mandatory reset has a duration determined by delay circuitry including a series of N flip-flops that use a combination of cells selected from different library cell types to induce robustness against glitch or fault attacks. The different flip-flop cells have different physical and functional characteristics that respond differently to glitch or fault attacks. N is selected to be sufficiently high to ensure a sufficient reset time duration of the mandatory reset. Also, the combined outputs of the N flip-flops are evaluated to provide additional robustness against clock manipulation. In addition, the latches of the semiconductor device are reconfigured into a scan chain for scan mode only after the mandatory delay has expired.

Figure 1:
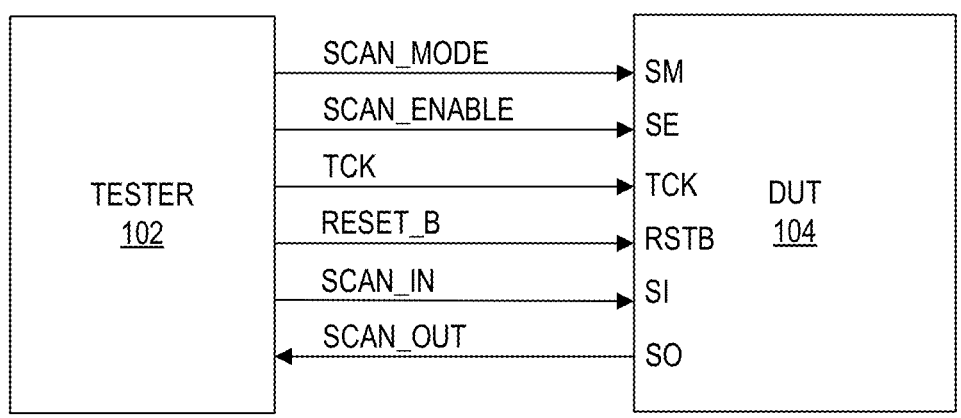
FIG. 1 is a simplified block diagram of a test system including a tester used to test a device under test (DUT) implemented according to an embodiment of the present disclosure.

FIG. 1 is a simplified block diagram of a test system 100 including a tester 102 used to test a device under test (DUT) 104 implemented according to an embodiment of the present disclosure. The tester 102 provides a SCAN_MODE signal, a SCAN_ENABLE signal, a test clock signal TCK, a global reset signal RESET_B, and a SCAN_IN signal to the DUT 104, which provides a SCAN_OUT signal. The SCAN_MODE signal is provided to an SM input of the DUT 104 and is asserted to enable the DUT 104 for the scan mode of operation for performing scan test operation. Enabling scan mode, for example, may enable TCK to control a primary clock signal CLK (see, e.g., FIG. 2) for controlling the latches of the DUT 104. The SCAN_ENABLE signal is a scan enable command signal provided to an SE input of the DUT 104 and is asserted by the tester 102 to command that the storage devices within the DUT 104 be reconfigured into a scan chain as further described herein. The TCK signal is a test clock signal that is provided to a TCK input of the DUT 104 and is toggled during the scan test to write scan data into the DUT 104. Although a separate test clock signal is shown, it may be provided to the main clock signal input (not shown) of the DUT 104 or it may otherwise be used to control the primary clock signal (e.g., CLK) during the scan mode. The global RESET_B signal is provided to an RSTB input of the DUT 104 and may be asserted to reset the storage devices of the DUT 104. it is noted that there may be multiple reset phases that are internally controlled by a central reset controller (not shown). The SCAN_IN signal is provided to an SI input of the DUT 104 and is used by the tester 102 to write scan data into the DUT 104 during the scan test. The SCAN_OUT signal is read out from a SO output of the DUT 104 to be examined by the tester 102 to determine the results of the scan test.

Although the test system 100 illustrates a single SCAN_IN and SCAN_OUT pair for testing using a signal scan chain, the tester 102 may be expanded for the case in which multiple scan chains are configured by the DUT 104. Operation for each of multiple scan chains is similar so that only one scan chain is shown and described as representative of scan testing in general.

In operation of the tester 102 to perform the scan test, the tester 102 asserts the SCAN_MODE and SCAN_ENABLE signals to initiate the scan test. The RESET_B signal remains negated while the SCAN_MODE signal remains asserted throughout the scan test. The tester 102 outputs scan data on the SCAN_IN signal while toggling TCK to write the scan data into the scan chain of the DUT 104. Once the scan data is fully written into the storage devices of the DUT 104, the tester 102 negates the SCAN_ENABLE signal to reconfigure the DUT 104 back into its normal operating mode, toggles the TCK (or the main clock) for one or more cycles, then re-asserts the SCAN_ENABLE signal, and finally toggles TCK while reading the test results from the SCAN_OUT signal. The test result data may be stored for subsequent evaluation.

Figure 2:
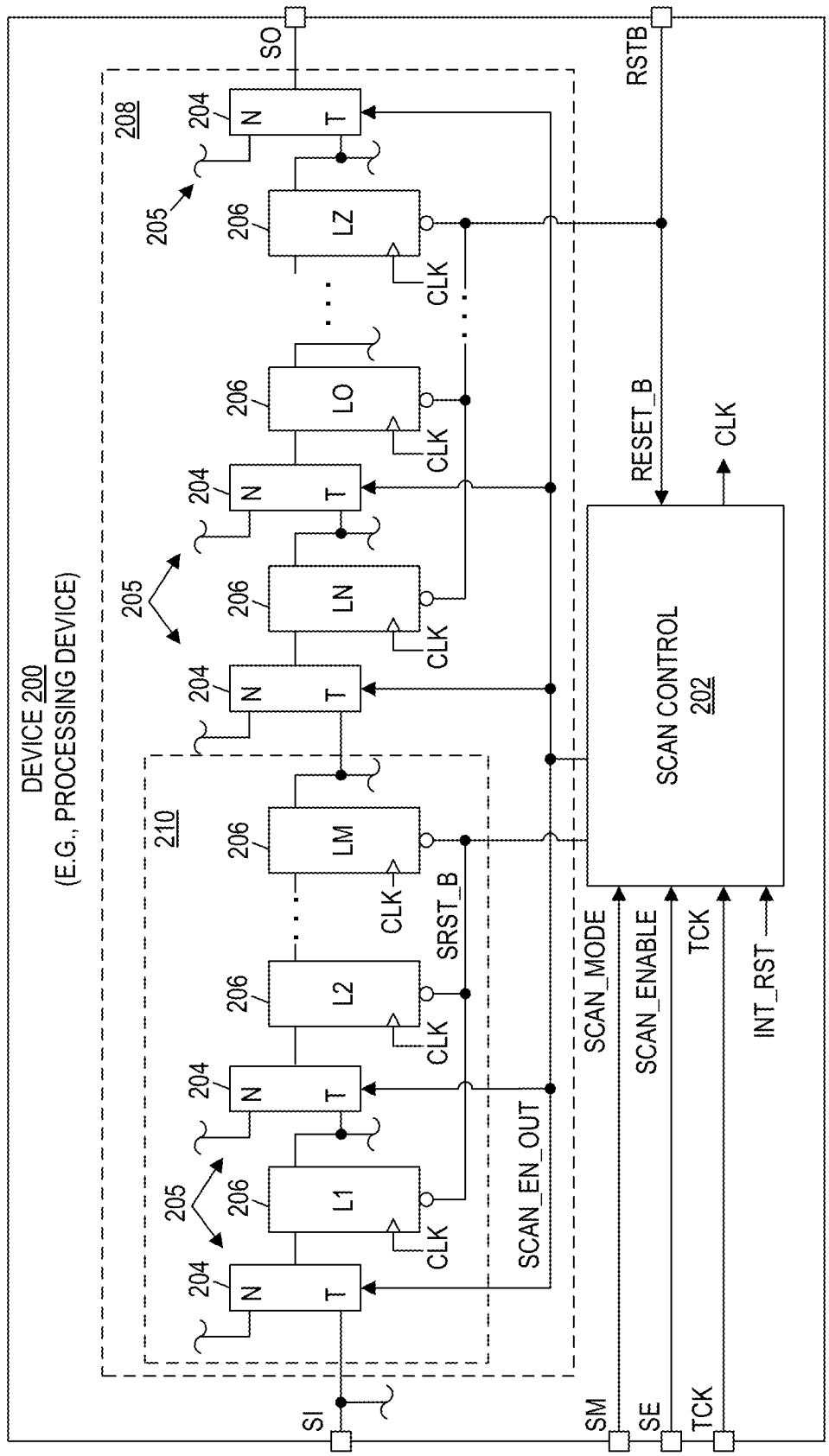
FIG. 2 is a simplified block diagram of a device implemented according to one embodiment of the present disclosure that is configured in a similar manner as the DUT of FIG. 1 so that it may be tested by the tester of FIG. 1.

FIG. 2 is a simplified block diagram of a device 200 implemented according to one embodiment of the present disclosure that is configured in a similar manner as the DUT 104 of FIG. 1 so that it may be tested by the tester 102. The device 200 may be configured as a processing device, such as a processor, a microcontroller, a central processing unit (CPU), a microprocessor, etc., or may be configured as any other type of device including peripheral devices. The device 200 is typically implemented as a semiconductor chip or device or integrated circuit (IC). The device 200 includes scan control circuitry 202 coupled to external pads or pins SM, SE, TCK, and RSTB for receiving the SCAN_MODE, SCAN_ENABLE, TCK, and RESET_B signals. The scan control circuitry 202 receives an internal reset signal INT_RST described further herein. The scan control circuitry 202 provides a scan enable control signal SCAN_EN_OUT to an enable or select input of each of a set of scan configuration circuits 204, which may collectively be referred to as scan configuration circuitry 205 of the device 200. The scan control circuitry 202 enables TCK to control the primary clock signal CLK during the scan mode. The device 200 further includes multiple latches 206, in which each latch 206 is a binary storage device that may also be referred to as a flip-flop or the like.

The latches 206 are distributed throughout the device 200 to perform the corresponding designed functions during a normal mode of operation. When in the normal mode, the SCAN_EN_OUT control signal is negated (e.g., asserted low) so that each scan configuration circuit 204 selects its normal or "N" input. The N input of each scan configuration circuit 204 is electrically coupled to other internal circuitry (not shown) of the device 200. Each of the storage devices 206 has an input shown coupled to the output of a corresponding one of the scan configuration circuits 204, and also has an output coupled to other portions of the internal circuitry (not shown) of the device 200. Thus, during the normal mode, each of the storage devices 206 is coupled to or coupled between internal circuitry (not shown) to perform normal functions. It is noted that the SI pin may have a different name and may perform a different function during normal operation and may be electrically coupled to other internal circuitry (not shown) of the device 200 for normal operation. Also, the SO pin, which is coupled to an output of a last one of the scan configuration circuits 204, may have a different name and function during the normal mode and may be electrically coupled to other internal circuitry (not shown) of the device 200.

Each scan configuration circuit 204 also includes a test or "T" input when the SCAN_EN_OUT signal is asserted (e.g., asserted high). When the SCAN_EN_OUT signal is asserted for scan test mode, the SI pin, which is coupled to the T input of a first scan configuration circuit 204, is electrically coupled to the input of a first storage device labeled L1. The output of L1 is coupled to the T input of a second scan configuration circuit 204, having its output coupled to the input of a second latch 206 labeled L2. This pattern is repeated up to another latch 206 labeled LM, having its output coupled through another scan configuration circuit 204 to the input of another latch 206 labeled LN, which has its output coupled through another scan configuration circuit 204 to the input of another latch 206 labeled LO, and this pattern is repeated to a last storage device labeled LZ. The output of LZ is coupled through the last scan configuration circuit 204 to the SO pin. Thus, in the scan mode when the SCAN_EN_OUT signal is asserted, the latches 206 are re-configured into a scan chain 208 between the scan input SI and the scan output SO. Each of the latches 206 has a clock input receiving the clock signal CLK, which is controlled by TCK during scan mode as further described herein. In this manner, when the SCAN_EN_OUT signal is asserted during the scan mode and while clock pulses are provided on TCK, each scan bit provided to SI is shifted through the scan chain 208, from L1 to L2 and so on to LM, and further to LN to LO and so on up to LZ.

A certain subset of the latches 206, such as including L1, L2, . . . , LM, are considered secure latches 210 that may hold sensitive data during normal operation. Since these secure latches 206 are also in the scan chain 208, then the data stored therein could be externally accessed during scan mode unless protective measures are taken. The RSTB pin is coupled to the reset inputs of the "non-secure" latches 206 that are not secure latches 210, and another reset signal SRST_B is provided to the secure latches 210. As described further herein, when the RESET_B signal is asserted to reset the non-secure latches 206 (e.g., LN, . . . , LZ), the SRST_B signal is also asserted so that the secure latches 210 are also reset. It is noted, however, that the RESET_B signal may be held unasserted during the scan mode. An unauthorized tester attempting to access the secure information may keep RESET_B de-asserted during the scan mode to avoid resetting the secure latches 210. The scan control circuitry 202, however, is configured to securely and robustly hold SRST_B asserted for a significant period of time upon entering the scan mode to clear and thus to prevent access of any sensitive data.

Although the secure latches 210 are shown as a sequential set of the latches 206 on one end of the scan chain 208, such location and grouping is arbitrary. In general, the secure latches 210 may be interspersed in any order within the scan chain 208 and not necessarily grouped together. In fact, one or more secure latches 210 may be isolated or grouped together at multiple locations within the scan chain 208 between one or more of the non-secure latches 206. Regardless of where located in the scan chain 208, any of the latches 206 that are designated as secure latches 210 receive the SRST_B signal at its reset input, and the remaining non-secure latches 206 receive the RESET_B signal via the RSTB pin. In an alternative embodiment, SRST_B may be provided instead to one or more and even up to all of the non-secure latches 206.

Figure 3:
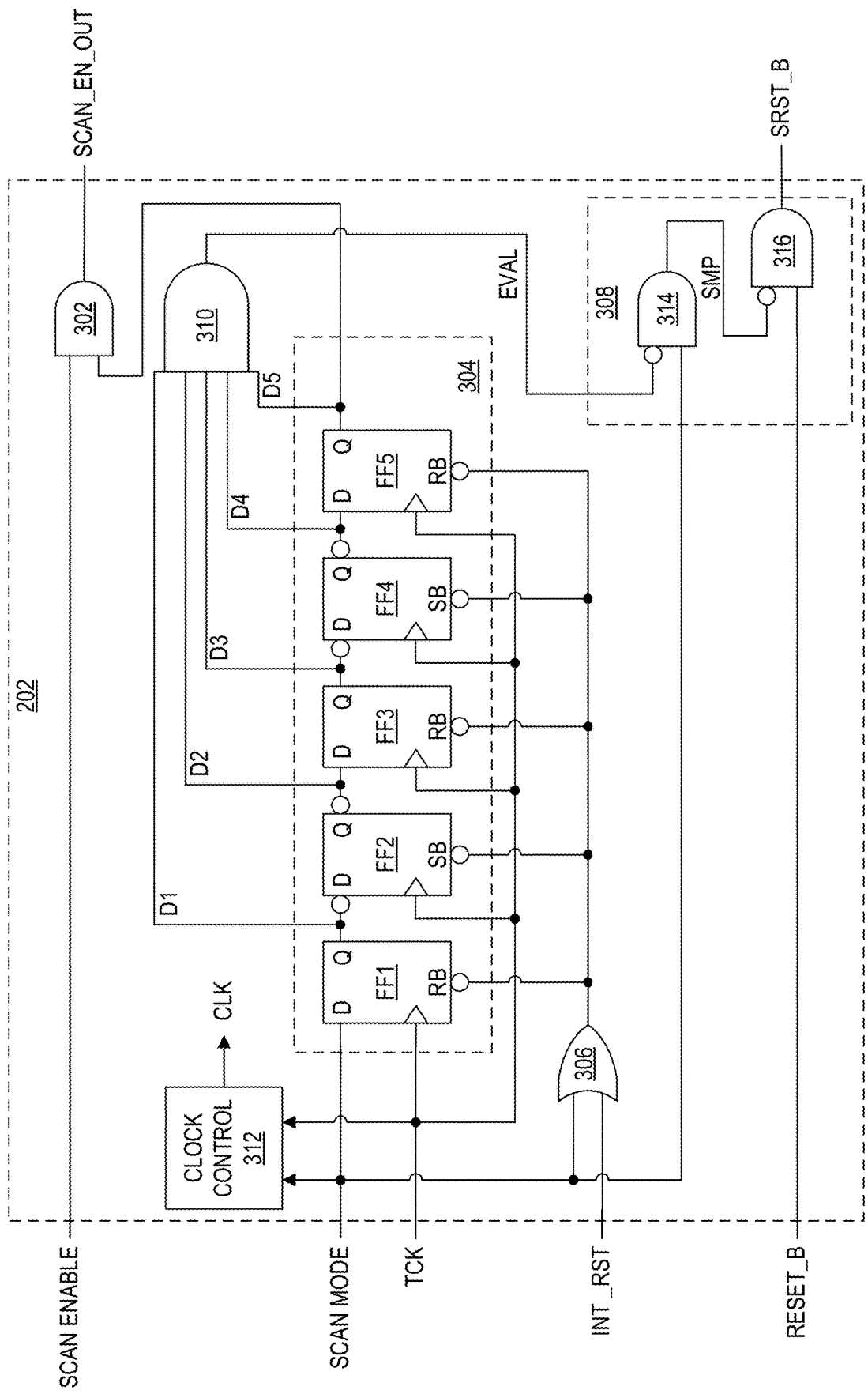
FIG. 3 is a schematic diagram of the scan control circuitry of FIG. 2 according to one embodiment of the present disclosure.

FIG. 3 is a schematic diagram of the scan control circuitry 202 according to one embodiment of the present disclosure. The SCAN_ENABLE signal is provided to an input of scan enable circuitry 302, having an output providing the SCAN_EN_OUT signal. In one embodiment as shown, the scan enable circuitry 302 is implemented as a 2-input Boolean logic AND gate. The SCAN_ENABLE signal may be considered a command by the tester 102 to enter the scan mode. The latches 206, however, are not reconfigured into the scan chain 208 until SCAN_EN_OUT is asserted, which is not asserted until a delay output signal D5 is also asserted. The SCAN_MODE signal is provided to an input of delay circuitry 304, to one input of reset bypass circuitry 306, and to one input of scan reset circuitry 308. The delay circuitry 304 has an output providing the delay output signal D5 to another input of the scan enable circuitry 302 and to one input of evaluation circuitry 310. TCK is provided to a clock input of the delay circuitry 304 and to one input of clock control circuitry 312, having another input receiving SCAN_MODE and having an output providing (or otherwise controlling) CLK when SCAN_MODE is asserted high. INT_RST is provided to the other input of the reset bypass circuitry 306, having its output coupled to a reset input of the delay circuitry 304. The RESET_B signal is provided to a second input of the scan reset circuitry 308, having a third input receiving an evaluation signal EVAL from the output of the evaluation circuitry 310. The scan reset circuitry 308 has an output providing the SRST_B signal.

In the illustrated embodiment, the delay circuitry 304 is configured as an N-bit delay block or counter, in which N is 5 in the illustrated embodiment. The delay circuitry 304 includes 5 flip-flops FF1, FF2, FF3, FF4, and FF5 coupled in series between its input receiving SCAN_MODE and its output providing the D5 signal. The flip-flops FF1-FF5 are shown as a series of D-type flip-flops, in which SCAN_MODE is provided to the D input of FF1, having its Q output providing a first delay signal D1 which is provided to an inverted D input of FF2, having its inverted Q output providing a second delay signal D2 which is provided to a D input of FF3, having its Q output providing a third delay signal D3 which is provided to an inverted D input of FF4, having its inverted Q output providing a fourth delay signal D4 which is provided to a D input of FF5, having its Q output providing the D5 signal as the delay output signal of the delay circuitry 304. The delay signals D1-D5 of the delay circuitry 304 are provided to respective inputs of the evaluation circuitry 310. The flip-flops FF1-FF5 each have a clock input receiving TCK. The odd-numbered flip-flops F1, F3, F5 each have an inverted reset input coupled to the output of the reset bypass circuitry 306. The even-numbered flip-flops F2 and F4 each have an inverted set input coupled to the output of the reset bypass circuitry 306. The even-numbered flip-flops F2 and F4, however, also have an inverted D input and an inverted D output so that from a logic perspective, the flip-flops F1-F5 have a similar logic function. In one embodiment, the reset bypass circuitry 306 is configured as a 2-input Boolean logic OR gate that prevents the flip-flops FF1-FF5 of the delay circuitry 304 from being "reset" (meaning set or reset depending upon the cell selected for the flip-flop) during scan mode while SCAN_MODE is asserted high. The output of the last flip-flop FF5 also provides the delay output signal D5 of the delay circuitry 304, which, as previously described, is provided to one input of the evaluation circuitry 310 and to one input of the scan enable circuitry 302.

The scan reset circuitry 308 may be configured as a pair of 2-input Boolean logic AND gates 314 and 316, each having one inverted input one non-inverted input. EVAL is provided to the inverted input of the AND gate 314, having its output providing a scan mode pulse (SMP) signal to the inverted input of the AND gate 316. SCAN_MODE is provided to the non-inverted input of the AND gate 314, and RESET_B is provided to the non-inverted input of the AND gate 316 having its output providing the SRST_B signal.

The size of the delay circuitry 304 is determined by the number of flip-flops, which is N=5 for the configuration illustrated in FIG. 3. The size N may alternatively be selected to be less than or greater than 5. The size of the delay circuitry 304 and the period of TCK determine the delay time that the secure latches 210 are held in reset prior to allowing the scan test to commence. In one embodiment, N is at least 3 to ensure sufficient time to clear any secure data stored by the secure latches 210. A larger size of the delay circuitry 304 increases the delay time, so that N should not be prohibitively large. A size of N=5 is an acceptable trade-off for the scan control circuitry 202 of FIG. 2, although any size of N greater than or equal to 3 is contemplated.

The flip-flops FF1-FF5 of the delay circuitry 304 may use different library cell types with different layouts to induce robustness against glitch or fault attacks. The different flip-flop cells have different physical and functional characteristics that respond differently to glitch or fault attacks. The flip-flops FF1, FF3 and FF5, for example, may be implemented by selecting a first D-type flip-flop cell type having an inverted reset input. The flip-flops FF2 and FF4, on the other hand, are implemented by selecting a second and different D-type flip-flop cell type with an inverted set input. In addition, the flip-flops FF2 and FF4 are configured with inverted inputs and inverted outputs, which may be implemented using separate inverters or the like. Library cells with different layouts react differently to the same attack scenario, and a combination of different library cells in the same circuit ensures non-predictable behavior thereby reducing the likelihood of a successful attack. The different library cells, for example, are less likely to settle to the same values in response to clock manipulation (e.g., glitchy clock, very small high-period, back-to-back fast pulses, variable clock voltage levels, etc.). The use of different library cells provides higher barrier when attempting to turn all flops metastable in the same cycle using clock manipulation. In this manner, the cost of any attack in an attempt to induce a favorable condition for releasing secure data increases.

Clock manipulation may potentially cause the last flip-flop FF5 to switch resulting in SCAN_EN_OUT being asserted prematurely (assuming SCAN_ENABLE is asserted high). The evaluation circuitry 310, however, simultaneously evaluates the delay signals D1-D5 at the outputs of the flip-flops FF1-FF5 of the delay circuitry 304. The delay signals D1-D5 collectively form a digital delay value (each delay signal is a binary value), so that the scan reset circuitry 308 is enabled only when the digital delay value is equal to a predetermined digital value established by the evaluation circuitry 310. In the illustrated embodiment, the evaluation circuitry 310 is configured as a 5-input AND gate receiving the delay signals D1-D5, so that EVAL is asserted high only when the digital delay value is equal to 11111b (in which "b" denotes a binary value. Otherwise, EVAL is held low at least for the duration of the period of the delay circuitry 304. When EVAL is low and SCAN_MODE is high, the SMP signal remains high so that SRST_B, which is provided at the output of the AND gate 316, remains low. As previously described, SRST_B low keeps the secure latches 210 in a state of reset.

Figure 4:
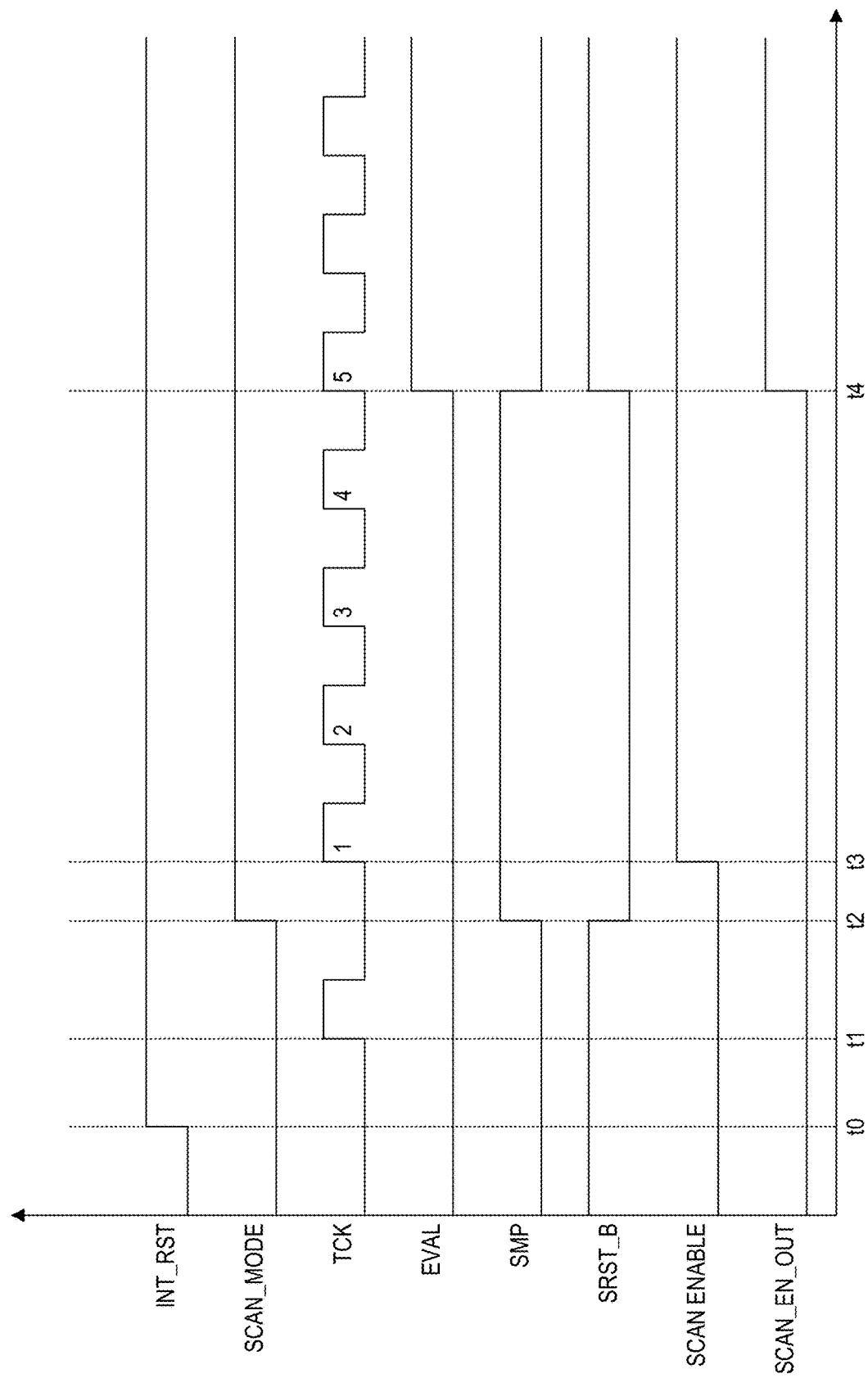
FIG. 4 is a timing diagram illustrating operation of the scan control circuitry of the device of FIG. 2 being tested by the tester of FIG. 1 according to one embodiment of the present disclosure.

FIG. 4 is a timing diagram illustrating operation of the scan control circuitry 202 of the device 200 being tested by the tester 102 according to one embodiment of the present disclosure (when the device 200 is the DUT 104). The timing diagram plots the INT_RST, SCAN_MODE, TCK, EVAL, SMP, SRST_B, SCAN_ENABLE and SCAN_EN_OUT signals versus time. Although not shown in the timing diagram, RESET_B remains de-asserted high. At an initial time t0, INT_RST is asserted high to pull the flip-flops FF1-FF5 of the delay circuitry 304 out of reset. D1-D5 are each initially reset low so that the initial digital delay value is 00000b. It is noted that although the flip-flops FF2 and FF4 are initially "set," their Q outputs are inverted so that the corresponding delay signals D2 and D4 are also initially low or 0. At this time SCAN_MODE and SCAN_ENABLE are de-asserted low so that the device 200 is not in scan mode. A pulse is asserted on TCK at a subsequent time t1, so that a zero (SCAN_MODE is low) is clocked through FF1 to keep D1 low. It is noted that the previous value of D1 is also low, or zero, which is clocked as a high, or one, into the FF2 in response to the pulse on TCK. The Q output of FF2, however, is also inverted so that D2 remains low at zero. Thus, the digital delay value remains at 00000b. SCAN_MODE, EVAL, SMP, SCAN_ENABLE and SCAN_EN_OUT remain low at time t1. Since SMP is low and RESET_B is high, SRST_B is initially high at time t1.

SRST_B is shown initially negated high since it is assumed that RESET_B is also negated high. It is noted, however, that RESET_B could be asserted low during this initial time which would pull SRST_B low as well. Although RESET_B resets the non-secure latches 206 directly when pulled low, the AND gate 316 also pulls SRST_B low when RESET_B is pulled low so that the secure latches 210 are also reset. Thus, RESET_B pulled low resets all of the latches 206 (even if SRST_B is provided to all of the latches 206 of the device 200). An unauthorized person attempting to access the secure data from the secure latches 210 during scan mode would keep RESET_B de-asserted high. As described further herein, however, the scan reset circuitry 308 of the scan control circuitry 202 pulls SRST_B low and robustly ensures that SRST_B remains asserted low for a significant period of time to clear any secure data in the secure latches 210 regardless of the state of RESET_B.

At a subsequent time t2, SCAN_MODE is asserted high. Since EVAL is low, the AND gate 314 asserts SMP high at time t2, so that the AND gate 316 pulls SRST_B low at time t2. SRST_B asserted low resets the secure latches 210 of the device 200 beginning when SCAN_MODE is asserted high. At subsequent time t3, SCAN_ENABLE is asserted high. Since D5 is still presumably low, the scan enable circuitry 302 (e.g., AND gate) keeps SCAN_EN_OUT low so that the scan configuration circuitry 205 keeps the device 200 in its normal functional mode. Also at time t3, a series of 5 clock pulses, numbered 1 to 5, are asserted on TCLK to propagate the high value of SCAN_MODE through the delay circuitry 304. Although not shown, D1 goes high in response to TCK 1, D2 goes high in response to TCK 2, D3 goes high in response to TCK 3, D4 goes high in response to TCK 4, and finally D5 goes high in response to TCK 5 at subsequent time t4.

At time t4 upon the 5$^{th}$ low-to-high transition of TCK, the delay signals D1-D5 are all asserted high so that the digital delay value is equal do the predetermined digital value (e.g., 11111b) so that the evaluation circuitry 310 asserts EVAL high. In response to EVAL asserted high, the AND gate 314 asserts SMP low, and assuming RESET_B is de-asserted high, SRST_B also goes high at time t4. In addition, when D5 (the output of the delay circuitry 304) is asserted high at time t4 while SCAN_ENABLE is also high, the scan enable circuitry 302 asserts SCAN_EN_OUT high to reconfigure the latches 206 into the scan chain 208. Scan testing may commence after time t4.

In summary, before scan testing is enabled to commence after assertion of SCAN_MODE, SRST_B is forced low from time t2 to time t4 which is after 5 transitions of TCK. SRST_B resets the secure latches 206 of the device 200 for a significant period of time to ensure that they are cleared of any secure data. The delay circuitry 304 forces SRST_B to remain low to keep the secure latches 206 reset for a predetermined number of TCK transitions depending upon the size (or length) of the delay circuitry 304. The latches 210 of the device 200, including the secure latches 206, are reconfigured into a scan chain only in response to assertion of the scan enable control signal SCAN_EN_OUT, which is only asserted while the scan enable command signal SCAN_ENABLE is asserted and only after the delay circuitry 304 completes the requisite count of TCK transitions. The delay circuitry 304 along with the evaluation circuitry 310 provides a robust defense against any attack in the form of clock tampering or manipulation (e.g., glitchy clock, very small high-period, back-to-back fast pulses, variable clock voltage levels, etc.). The elements or flip-flops of the delay circuitry 304 selected from different cell libraries provides robustness in the form of a higher barrier for success for an unauthorized person attempting to turn all of the flip-flops metastable in the same clock cycle. The evaluation circuitry 310 simultaneously monitors the collective output of the individual flip-flops of the delay circuitry 304 so that the forced reset pulse is terminated only when the digital delay value of the delay circuitry 304 achieves a predetermined digital state as determined by the evaluation circuitry 310. In addition, any internally generated resets are bypassed using scan mode reset. The delay circuitry 304 is re-initialized at each scan entry to prevent multiple mode entries in an attempt to advance the "count" from D1 to the delay circuitry output (e.g., D5).

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like. For example, logic states, such as logic low and logic high may be reversed depending upon whether the pin or signal is implemented in positive or negative logic or the like. In some cases, the logic state may be programmable in which the logic state may be reversed for a given logic function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A semiconductor device, comprising:
   scan configuration circuitry that, in response to assertion of a scan enable control signal, reconfigures a plurality of latches from a functional configuration to a scan chain comprising the plurality of latches coupled in series; and
   scan control circuitry, comprising:
      delay circuitry comprising N flip-flops that are clocked by a test clock and that are coupled in series comprising a first flip-flop having an input receiving a scan mode signal and a last flip-flop having an output providing a delay output signal, wherein the delay circuitry asserts the delay output signal after N transitions of the test clock signal while the scan mode signal is asserted, wherein N is an integer greater than 1;
      scan enable circuitry that asserts the scan enable control signal when a scan enable command signal and the delay output signal are both asserted;
      evaluation circuitry that asserts an evaluation signal when a collective state of the N flip-flops has achieved a predetermined state after the scan mode signal is asserted; and
      scan reset circuitry that keeps each of at least a subset of the plurality of latches in a predetermined reset state until assertion of both the evaluation signal and the scan mode signal.

2. The semiconductor device of claim 1, wherein at least two of the N flip-flops of the delay circuitry comprise cells selected from a different flip-flop library that have different physical and functional characteristics.

3. The semiconductor device of claim 1, wherein at least one of the N flip-flops comprises a first D-type flip-flop cell having a reset input and wherein at least one of the N flip-flops comprises a second D-type flip-flop cell having a set input.

4. The semiconductor device of claim 3, wherein each of the at least one second D-type flip-flop cell comprises an inverted input and an inverted output.

5. The semiconductor device of claim 1, wherein the evaluation circuitry comprises a logic AND gate having N inputs each coupled to an output of a corresponding one of the N flip-flops and having an output providing the evaluation signal.

6. The semiconductor device of claim 1, wherein the subset of the plurality of latches are secure latches that store secure data during a normal operating mode.

7. The semiconductor device of claim 1, wherein the scan reset circuitry comprises:
   a first logic AND gate having a first input receiving the evaluation signal, having a second input receiving the scan mode signal, and having an output providing a scan mode pulse signal; and
   a second logic AND gate having a first input receiving the scan mode pulse signal, having a second input receiving a global reset signal, and having an output providing a scan reset signal that is provided to a reset input of each of the subset of the plurality of latches.

8. The semiconductor device of claim 7, wherein when the scan mode signal is asserted high while the global reset signal is de-asserted high, the scan reset signal remains asserted low until the evaluation signal is asserted high.

9. The semiconductor device of claim 1, further comprising reset bypass circuitry having an input receiving the scan mode signal and an output coupled to a reset input of each of the N flip-flops of the delay circuitry, wherein the reset bypass circuitry prevents the delay circuitry from being reset while the scan mode signal is asserted.

10. The semiconductor device of claim 1, further comprising clock control circuitry having inputs receiving the scan mode signal and the test clock signal and having an output for controlling a main clock signal provided to clock inputs of the plurality of latches, wherein the test clock signal clocks the plurality of latches while the scan mode signal is asserted.

11. The semiconductor device of claim 1, wherein the scan enable circuitry comprises a logic AND gate having a first input receiving the scan enable command signal, a second input receiving the delay output signal, and an output providing the scan enable control signal.

12. A method, comprising:
   reconfiguring a plurality of latches of a semiconductor device from a functional mode to a scan chain in response to assertion of a scan enable control signal;
   delaying assertion of a delay output signal in response to assertion of a scan mode signal by N transitions of a test clock using N flip-flops coupled in series, wherein N is an integer greater than 1;
   asserting the scan enable control signal when a scan enable command signal and the delay output signal are both asserted;
   asserting an evaluation signal when a collective state of the N flip-flops has achieved a predetermined state after the scan mode signal is asserted; and
   keeping each of at least a subset of the plurality of latches in a predetermined reset state until assertion of both the evaluation signal and the scan mode signal.

13. The method of claim 12, further comprising selecting at least two of the flip-flops from cells of different flip-flop libraries having different physical and functional characteristics.

14. The method of claim 12, wherein the asserting an evaluation signal comprises logically ANDing outputs of the N flip-flops.

15. The method of claim 12, wherein keeping each of at least a subset of the plurality of latches in a predetermined reset state until assertion of both the evaluation signal and the scan mode signal comprises keeping each of a plurality of secure latches of the semiconductor device in the predetermined reset state until assertion of both the evaluation signal and the scan mode signal.

16. The method of claim 12, further comprising:
   providing a scan mode pulse signal by logically ANDing the evaluation signal, having a second input receiving the scan mode signal; and
   providing a scan reset signal that keeps each of at least a subset of the plurality of latches in a predetermined reset state by logically ANDing the scan mode pulse signal and a global reset signal.

17. The method of claim 16, further comprising keeping the scan reset signal asserted low until the evaluation signal is asserted high while the scan mode signal is asserted high and the global reset signal is de-asserted high.

18. The method of claim 12, further comprising preventing the N flip-flops from being reset while the scan mode signal is asserted.

19. The method of claim 12, further comprising clocking the plurality of latches of the semiconductor device using the test clock while the scan mode signal is asserted.

20. The method of claim 12, further comprising providing the scan enable control signal by logically ANDing the scan enable command signal and the delay output signal.

* * * * *